United States Patent
Chen

(10) Patent No.: US 7,170,912 B2
(45) Date of Patent: Jan. 30, 2007

(54) LASER DRILLING SYSTEM AND METHOD FOR FLEXIBLE PRINTED CIRCUIT BOARD

(75) Inventor: Ga-Lane Chen, Fremont, CA (US)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/238,485

(22) Filed: Sep. 28, 2005

(65) Prior Publication Data
US 2006/0078013 A1     Apr. 13, 2006

(30) Foreign Application Priority Data
Oct. 8, 2004     (TW) ............................. 93130548 A

(51) Int. Cl.
*H01S 3/10* (2006.01)
*B23K 26/00* (2006.01)

(52) U.S. Cl. .................. 372/22; 219/121.71; 372/9

(58) Field of Classification Search .............. 372/22; 219/121.71
See application file for complete search history.

(56) References Cited

U.S. PATENT DOCUMENTS 5,292,686 A * 3/1994 Riley et al. ............... 438/605

* cited by examiner

*Primary Examiner*—Armando Rodriguez
(74) *Attorney, Agent, or Firm*—Morris Manning & Martin; Tim Tingkang Xia, Esq.

(57) ABSTRACT

A laser drilling system for flexible printed circuit board includes a first mirror, a second mirror, a laser crystal, a third harmonic generator and a second harmonic generator. The first mirror and the second mirror are spaced apart and defined a resonator cavity therebetween. The laser crystal is disposed in the resonator cavity for generating a fundamental laser beam. The third harmonic generator and the second harmonic generator are disposed the resonator cavity. A fundamental laser beam is directed to the second harmonic generator for generating a second harmonic laser beam, the fundamental laser beam and the second laser harmonic laser beam is directed to the third harmonic generator for generating a third harmonic laser beam, the third harmonic laser beam is output from the resonator cavity. A laser drilling method for flexible printed circuit board is also provided.

16 Claims, 1 Drawing Sheet

LASER DRILLING SYSTEM AND METHOD FOR FLEXIBLE PRINTED CIRCUIT BOARD

FIELD OF THE INVENTION

The present invention relates to laser drilling techniques, and particularly to a laser drilling system and method for drilling holes in a flexible printed circuit board.

GENERAL BACKGROUND

A flexible printed circuit board (FPCB) is a printed circuit board having a base material composed of polyester resin or polyimide resin. The flexible printed circuit board can be variously bent and folded according to the needs of any particular application. The flexible printed circuit board has a small volume, and features good heat dissipation performance and ease of assembly.

A conventional method for making an FPCB includes the following steps: selecting a base material; imaging in an inner layer of the base material; surface treatment; laminating; drilling; pretreating; hole metallization; imaging; pattern plating; releasing a formed film; etching; and machining outer shape of FPCB. A rate of production of the FPCB directly depends on a rate of drilling. Further, the quality of drilled via holes directly determines the quality and performance of the FPCB.

Conventionally, there are two kinds of methods for drilling via holes in an FPCB: a mechanical drilling method, and a laser drilling method. The mechanical drilling method utilizes a small drill bit to machine via holes in the FPCB. The mechanical drilling method is generally regarded as time-consuming. In addition, the quality of the via holes made in the FPCB by the mechanical drilling method may be unsatisfactory. In addition, some debris may remain in the via holes. This can result in short circuits or open circuits in the electric circuits of the FPCB. The laser drilling method can overcome many or even all of the above-mentioned problems associated with the mechanical drilling method. Via holes with small diameters can be efficiently obtained via the laser drilling method.

A conventional laser drilling system is shown in FIG. 1. A laser beam 12 from a $CO_2$ laser source 11 sequentially passes through a collimating lens 131 and a screen 132 of an optic image transfer system 13, and is incident on a galvanomirror 14. The reflected laser beam 12 from the galvanomirror 14 passes through an $f_\theta$ lens 15, and then is incident on the FPCB 161 placed on a working table 16. Via holes are thereby defined in the FPCB 161.

Thus, the via holes with small diameters are obtained by the laser drilling method using a $CO_2$ laser source. However, the laser beam generated by the $CO_2$ laser source is in a form of a long pulse. The percentage of unstable pulses is generally more than 2%, which makes the drilling process unstable and may diminish the uniformity of the via holes. In addition, the long wavelength and high power of the laser beam may result in relatively low precision of the via holes. Furthermore, some debris may remain in the via holes. If this occurs, special treatment for removing the debris may be required.

What is needed, therefore, is to provide a new laser drilling system and method for drilling via holes in an FPCB, which system and method can overcome the above-described problems.

SUMMARY

In a preferred embodiment, a laser drilling system for a substrate like a flexible primed circuit board includes a first reflector, a second reflector, a laser crystal, a third harmonic generator, a second harmonic generator and a prism. The first reflector and the second reflector are spaced apart and define a resonator cavity therebetween. The laser crystal is disposed in the resonator cavity for generating a fundamental laser beam. The third harmonic generator and the second harmonic generator are disposed in the resonator cavity. The prism is disposed in the resonator cavity. A fundamental laser beam is directed to the second harmonic generator for generating a second harmonic laser beam, the fundamental laser beam and the second harmonic laser beam are directed to the third harmonic generator for generating a third harmonic laser beam, and the third harmonic laser beam is separated by the prism from the fundamental and second harmonic laser beams and is output from the resonator cavity as an output laser beam. The third harmonic laser beam has the following parameters: a wavelength of 355 nm; up to 5 watts output power; a beam quality $M^2$ value; and a pulse width of 50 ns at 10 KHz.

In another preferred embodiment, a laser drilling method for the substrate like the flexible printed circuit board includes the following steps: providing a first mirror and a second mirror spaced apart and defining a resonator cavity therebetween; positioning in said resonator cavity a laser crystal capable of being excited to generate a fundamental laser beam, and a second harmonic generator, and a third harmonic generator; directing said fundamental laser beam into said second harmonic generator to produce a second harmonic laser beam; directing said second harmonic laser beam and said fundamental laser beam into said third harmonic generator to generate a third harmonic laser beam by a sum of the frequency mixing of said fundamental laser beam and said second harmonic laser beam; separating said third harmonic laser beam for output from said resonator cavity as an output laser beam, the output laser beam having the following parameters: a wavelength of 355 nm; up to 5 watts output power; a beam quality $M^2$ value; and a pulse width of 50 ns at 10 KHz; and directing the output laser beam to the flexible printed circuit board to form holes.

Other advantages and novel features will become more apparent from the following detailed description when taken in conjunction with the accompanying drawings, in which:

DETAILED DESCRIPTION OF PREFERRED EMBODIMENTS

Figure 1:
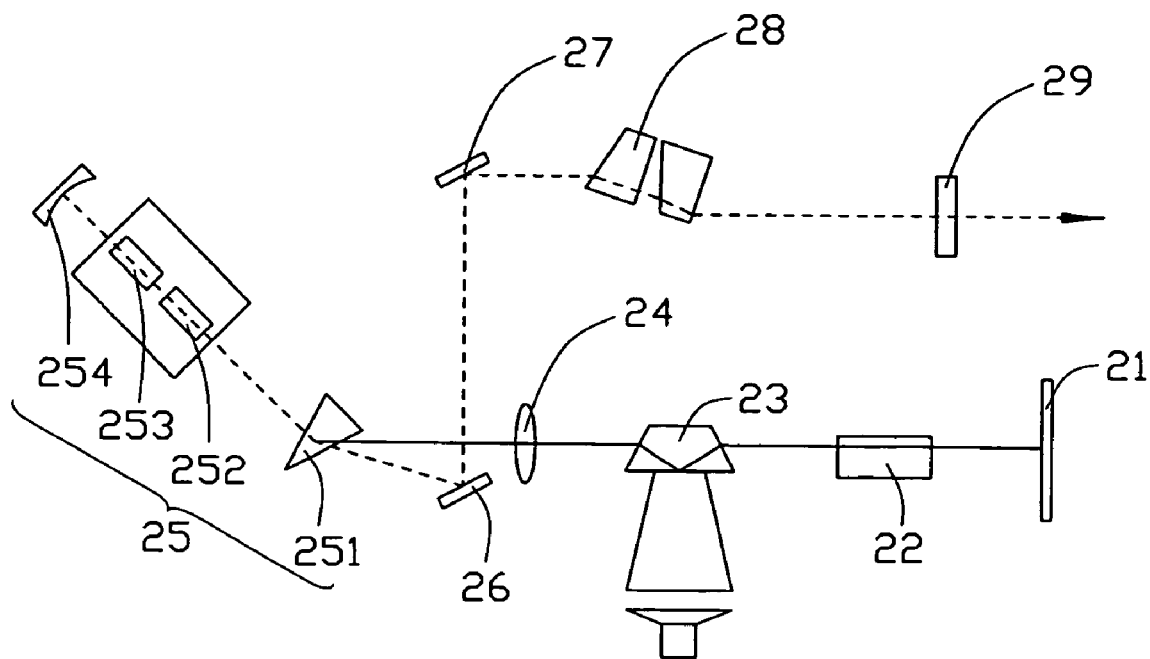
FIG. 1 is a schematic diagram of a laser drilling system according to a preferred embodiment of the present invention, showing essential optical paths thereof.
Figure 2:
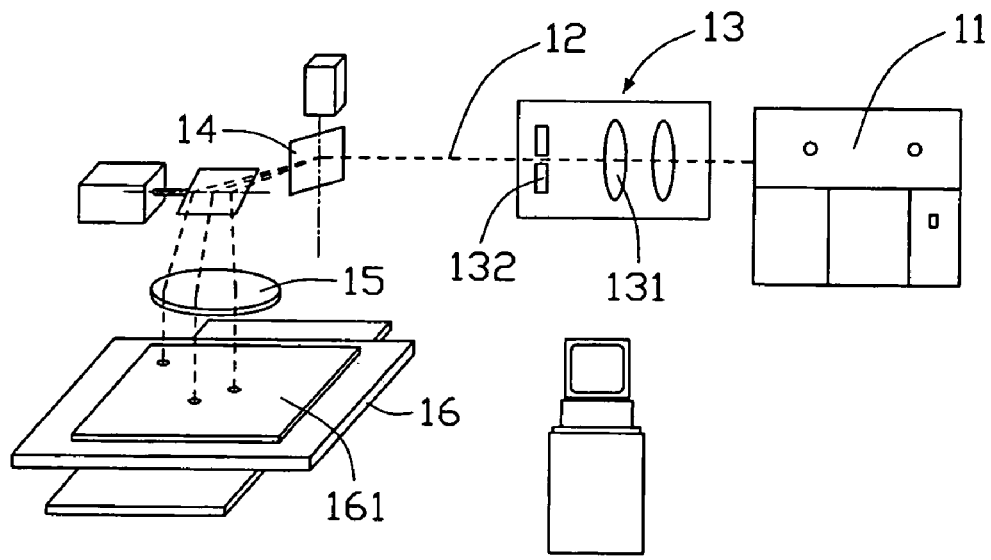
FIG. 2 is a schematic diagram of a conventional laser drilling system, showing essential optical paths thereof.

Referring now to FIG. 1, a laser drilling system for a substrate like a flexible printed circuit board according to a preferred embodiment of the present invention includes a plane mirror 21, a Q-switch 22, a laser crystal 23, a lens 24, an intra-cavity frequency doubling system 25, a pick-off reflector 26, a reflector 27, an anamorphic prism pair 28, and an output window 29. The intra-cavity frequency doubling system 25 includes a prism 251, a third harmonic generator 252, a second harmonic generator 253, and a concave mirror 254.

The plane mirror 21 and the concave mirror 254 are spaced apart, thereby defining a resonator cavity (not shown) therebetween. The Q-switch 22, the laser crystal 23, the lens 24, the prism 251, the third harmonic generator 252, the second harmonic generator 253 and the pick-off reflector 26 are placed within the resonator cavity. The laser crystal 23 may be neodymium yttrium orthovanadate doped with neodymium ions (Nd:YVO4), or yttrium aluminum garnet doped with neodymium ions (Nd:YAG), for generating a fundamental laser beam. The Q-switch 22 is placed between the laser crystal 23 and the plane mirror 21, for modulating the fundamental laser beam. The lens 24 is positioned between the prism 251 and the laser crystal 23 for focusing the fundamental laser beam modulated by the Q-switch 22. The second harmonic generator 253 is positioned between the laser crystal 23 and the concave mirror 254, for generating a second harmonic laser beam. The third harmonic generator 252 is positioned between the second harmonic generator 253 and the laser crystal 23, for generating a third harmonic laser beam. The prism 251 is positioned between the third harmonic generator 252 and the laser crystal 23, for separating the third harmonic laser beam from the fundamental laser beam and the second harmonic laser beam. The pick-off reflector 26 is disposed between the lens 24 and the prism 251, for directing the third harmonic laser beam from the prism 251 out of the resonator cavity. The reflector 27 is disposed outside the resonator cavity, for reflecting the laser beam from the pick-off reflector 26. The anamorphic prism pair 28 is disposed outside the resonator cavity, for refracting the laser beam from the reflector 27. The output window 29 is disposed outside the resonator cavity in an exit direction of the laser beam from the anamorphic prism pair 28.

In general, as known to people skilled in the art, the beam quality of a laser is described by an $M^2$ value, for which the lowest possible value of 1.0 describes a perfect Gaussian beam. The laser drilling system can generate a laser beam having the following parameters: a wavelength of 355 nm; an output power of up to about 5 watts; a beam quality $M^2$ value of less than 1.2; a pulse width of 50 ns at 10 KHz; and a beam diameter of 0.9 mm.

A fundamental laser beam having a wavelength of 1064 nm generated by the laser crystal 23 is modulated by the Q-switch 22 to generate a fundamental narrow pulse width laser beam. The fundamental narrow pulse width laser beam is directed to the plane mirror 21 and reflected by the plane mirror 21. Then, the fundamental narrow pulse width laser beam obtained by the laser crystal 23 and the Q-switch 22 is focused by the lens 24, and sequentially passes through the prism 251, the third harmonic generator 252, and the second harmonic generator 253. The fundamental narrow pulse width laser beam is then reflected by the concave mirror 254. The fundamental narrow pulse width laser beam reflected by the concave mirror 254 is directed to the second harmonic generator 253 and the third harmonic generator 252 in that order. A second harmonic laser beam having a wavelength of 530 nm is generated by the second harmonic generator 253, and is merged with the remaining fundamental narrow pulse width laser beam. A third harmonic laser beam having a wavelength of 355 nm is generated by the third harmonic generator 252. The fundamental narrow pulse width laser beam having the wavelength of 1064 nm, the second laser beam having the wavelength of 533 nm and the third harmonic laser beam having the wavelength of 355 nm are directed to be incident on the prism 251. The third harmonic laser beam is separated from the fundamental laser beam and the second harmonic laser beam by the prism 251.

Only the third harmonic laser beam having the wavelength of 355 nm is extracted by the prism 251, and exits from the resonator cavity. The third harmonic laser beam is reflected by the pick-off reflector 26 and the reflector 27. The third harmonic laser beam then passes through the anamorphic prism pair 28 and the output window 29, and is incident on the FPCB (not shown) placed on a working table (not shown). The third harmonic laser beam has the following parameters: a wavelength of 355 nm; an output power of up to about 5 watts; a beam quality $M^2$ value of less than 1.2; a pulse width of 50 ns at 10 KHz; and a beam diameter of 0.9 mm.

A method for drilling via holes in an FPCB according to an exemplary embodiment of the present invention is performed by means of the laser drilling system. As described above, the laser drilling system provides a laser beam having the following parameters: a wavelength of 355 nm; an output power of up to 5 watts; a beam quality $M^2$ value of less than 1.2; a pulse width of 50 ns at 10 KHz; and a beam diameter of 0.9 mm.

The method includes the following steps: providing a laser drilling system generating a narrow pulse width laser beam, which has the following parameters: a wavelength of 355 nm; a power of up to 5 watts; a beam quality $M^2$ value of less than 1.2; and a pulse width of 50 ns at 10 KHz; and directing the laser beam to an FPCB to evaporate portions of the FPCB so as to define via holes in the FPCB.

The first step includes the following sub-steps: providing a first mirror and a second mirror spaced apart from each other, the first and the second mirrors cooperatively defining a resonator cavity; positioning a laser crystal capable of being excited to generate a fundamental laser beam, a second harmonic generator, and a third harmonic generator in the cavity; directing the fundamental laser beam to the second harmonic generator to generate a second harmonic laser beam; directing the second harmonic laser beam and the fundamental laser beam to the third harmonic generator to generate a third harmonic laser beam merged with the fundamental laser beam and the second harmonic laser beam; and separating the third harmonic laser beam from the fundamental laser beam and the second harmonic laser beam, and directing the third harmonic laser beam to exit from the resonator cavity as an output laser beam, the output laser beam having the following parameters: a wavelength of 355 nm; an output power of up to 5 watts; a beam quality $M^2$ value of less than 1.2; a pulse width of 50 ns at 10 KHz; and a beam diameter of 0.9 mm.

In an alternative embodiment, the plane mirror 21 and the concave mirror 254 can be replaced by other suitable reflector means known to those skilled in the art. Also, the lens 24 can be another kind of suitable focusing means.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A laser drilling system for drilling via holes in a flexible printed circuit board, comprising:
    a first reflector;
    a second reflector, the first reflector and the second reflector being spaced apart from each other and cooperatively defining a resonator cavity;

a laser crystal disposed in the resonator cavity for generating a fundamental laser beam;

a second harmonic generator disposed in the resonator cavity for converting a portion of the fundamental laser beam into a second harmonic laser beam;

a third harmonic generator disposed in the resonator cavity for converting a portion of the fundamental laser beam and the second harmonic laser beam into a third harmonic laser beam; and a prism disposed in the resonator cavity for separating the third harmonic laser beam from the fundamental laser beam and the second harmonic laser beam as an output laser beam; wherein the third harmonic laser beam has the following parameters: a wavelength of 355 nm; up to 5 watts output power; a beam quality $M^2$ value of less than 1.2; and a pulse width of 50 ns at 10 KHz.

2. The laser drilling system as claimed in claim 1, further comprising a Q-switch disposed in the resonator cavity between the second reflector and the laser crystal.

3. The laser drilling system as claimed in claim 1, further comprising a pick-off reflector disposed in the resonator cavity, for reflecting the third harmonic laser beam from the prism.

4. The laser drilling system as claimed in claim 3, further comprising a reflector disposed outside the resonator cavity, for reflecting the third harmonic laser beam reflected by the pick-off reflector.

5. The laser drilling system as claimed in claim 4, further comprising an anamorphic prism pair disposed outside the resonator cavity, for refracting the third harmonic laser beam reflected by the reflector.

6. The laser drilling system as claimed in claim 1, wherein the second harmonic generator is positioned between the laser crystal and the concave mirror, and the third harmonic generator is positioned between the second harmonic generator and the laser crystal.

7. The laser drilling system as claimed in claim 6, further comprising a lens disposed between the laser crystal and the second harmonic generator, for focusing the fundamental laser beam.

8. The laser drilling system as claimed in claim 1, wherein the laser crystal is one of neodymium yttrium orthovanadate doped with neodymium ions (Nd:YVO$_4$) and yttrium aluminum garnet doped with neodymium ions (Nd:YAG).

9. A method for drilling holes in a flexible printed circuit board, comprising the steps of:

providing a first mirror and a second mirror spaced apart from each other, the first and second mirrors cooperatively defining a resonator cavity;

positioning a laser crystal capable of generating a fundamental laser beam, a second harmonic generator, and a third harmonic generator in the resonator cavity;

directing the fundamental laser beam into the second harmonic generator to produce a second harmonic laser beam;

directing the second harmonic laser beam and the fundamental laser beam into the third harmonic generator to produce a third harmonic laser beam;

separating the third harmonic laser beam from the second harmonic laser beam and the fundamental laser beam, and directing the third harmonic laser beam to exit from the resonator cavity as an output laser beam, the output laser beam having the following parameters: a wavelength of 355 nm; an output power of up to 5 watts; a beam quality $M^2$ value of less than 1.2; and a pulse width of 50 ns at 10 KHz; and directing the output laser beam to be incident on the flexible printed circuit board to define the holes therein.

10. The laser drilling method as claimed in claim 9, wherein the laser crystal is one of neodymium yttrium orthovanadate doped with neodymium ions (Nd:YVO4) and yttrium aluminum garnet doped with neodymium ions (Nd:YAG).

11. The laser drilling method as claimed in claim 9, further comprising the step of: disposing a Q-switch in the resonator cavity.

12. The laser drilling method as claimed in claim 9, wherein the step of separating the third harmonic laser beam is performed by way of disposing a prism in the resonator cavity.

13. The laser drilling method as claimed in claim 9, wherein the step of directing the output laser beam to be incident on the flexible printed circuit board to define holes is performed by way of disposing a pick-off reflector in the resonator cavity for reflecting the output laser beam to exit from the resonator cavity.

14. The laser drilling method as claimed in claim 13, wherein the step of directing the output laser beam to be incident on the flexible printed circuit board to define holes is performed by way of disposing a reflector outside the resonator cavity for reflecting the output laser beam from the pick-off reflector.

15. A method for drilling holes in a substrate, comprising the steps of:

preparing a substrate to be drilled;

providing a laser generating system capable of drilling said substrate with a laser beam generated by said system;

marking locations corresponding to a plurality of preset holes on said substrate; and drilling said plurality of holes in said substrate based on said marked locations by means of conducting said laser beam to said marked locations;

wherein said laser beam generated by said laser generating system is characterized by a wavelength of 355 nm, an output power of up to 5 watts, a beam quality $M^2$ value of less than 1.2, and a pulse width of 50 ns at 10 KHz.

16. The method as claimed in claim 15, wherein said laser generating system comprises a selective one of a laser crystal with neodymium yttrium orthovanadate doped with neodymium ions (Nd:YVO4) and a laser crystal with yttrium aluminum garnet doped with neodymium ions (Nd:YAG).

* * * * *